United States Patent
Bock et al.

(10) Patent No.: US 10,180,486 B2
(45) Date of Patent: Jan. 15, 2019

(54) TEST STANDARDS AND METHODS FOR IMPEDANCE CALIBRATION OF A PROBE SYSTEM, AND PROBE SYSTEMS THAT INCLUDE THE TEST STANDARDS OR UTILIZE THE METHODS

(71) Applicant: Cascade Microtech, Inc., Beaverton, OR (US)

(72) Inventors: Daniel M. Bock, Portland, OR (US); Samantha Nhim, Tigard, OR (US); Lynh Thuy Bui, Tigard, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 2 days.

(21) Appl. No.: 15/072,204

(22) Filed: Mar. 16, 2016

(65) Prior Publication Data

US 2017/0269183 A1    Sep. 21, 2017

(51) Int. Cl.
*G01R 35/00* (2006.01)
*G01R 1/067* (2006.01)
(Continued)

(52) U.S. Cl.
CPC .......... *G01R 35/005* (2013.01); *G01R 1/067* (2013.01); *G01R 31/2886* (2013.01);
(Continued)

(58) Field of Classification Search
CPC ...... G01R 35/005; G01R 1/067; G01R 1/073; G01R 1/07307; G01R 1/07392
(Continued)

(56) References Cited

U.S. PATENT DOCUMENTS 5,617,340 A * 4/1997 Cresswell .......... G01R 31/2818
702/85
8,791,705 B2 * 7/2014 Zelder .................... G01R 27/32
324/601
(Continued)

FOREIGN PATENT DOCUMENTS

JP   2005-331264    12/2005
WO  WO2005/043176   5/2005

OTHER PUBLICATIONS

English-language abstract of Japanese Patent Publication No. JP2005-331264, dated Dec. 2, 2005.

*Primary Examiner* — Tung X Nguyen
*Assistant Examiner* — Robert P Alejnikov, Jr.
(74) *Attorney, Agent, or Firm* — Dascenzo Intellectual Property Law, P.C.

(57) ABSTRACT

Test standards and methods for impedance calibration of a probe system and probe systems that include the test standards and/or utilize the methods are disclosed herein. The test standards include at least one test structure. In some embodiments, the test standard further includes an alignment structure that is associated with the test structure. In some embodiments, the test standards include a plurality of test structures. In some embodiments, the plurality of test structures includes a thin film thru test structure and a thin film offset test structure. In some embodiments, the plurality of test structures is positioned to simultaneously contact a plurality of probe regions of a probe head. The methods include methods of calibrating a probe system.

12 Claims, 8 Drawing Sheets

(51) Int. Cl.
*G01R 31/28* (2006.01)
*G01R 31/319* (2006.01)
*H01L 21/66* (2006.01)

(52) U.S. Cl.
CPC ........ *G01R 35/007* (2013.01); *G01R 31/3191* (2013.01); *H01L 22/34* (2013.01)

(58) Field of Classification Search
USPC ........................................ 324/754.02, 754.03
See application file for complete search history.

(56) References Cited

U.S. PATENT DOCUMENTS

| | | | | |
|---|---|---|---|---|
| 2006/0010358 A1* | 1/2006 | Miller | ................. | G01R 31/3016 714/700 |
| 2010/0001742 A1* | 1/2010 | Strid | .................... | G01R 35/005 324/601 |
| 2012/0105093 A1* | 5/2012 | Lee | .................... | G01R 31/2853 324/762.01 |
| 2012/0168964 A1* | 7/2012 | Kim | .................. | G01R 1/07307 257/777 |
| 2014/0327461 A1* | 11/2014 | Fan | .................... | G01R 1/06716 324/750.25 |
| 2015/0241472 A1 | 8/2015 | Negishi et al. | | |

* cited by examiner

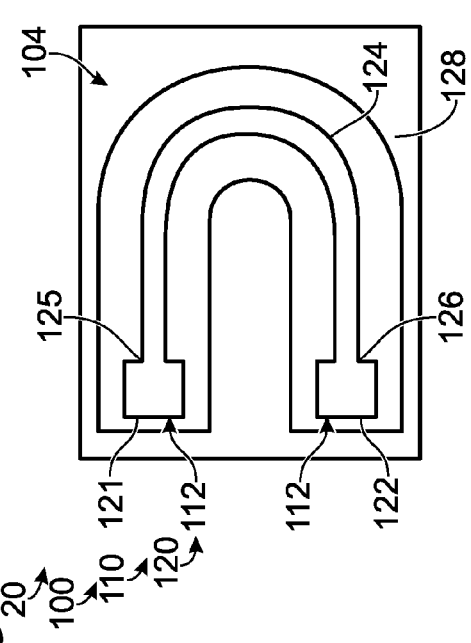
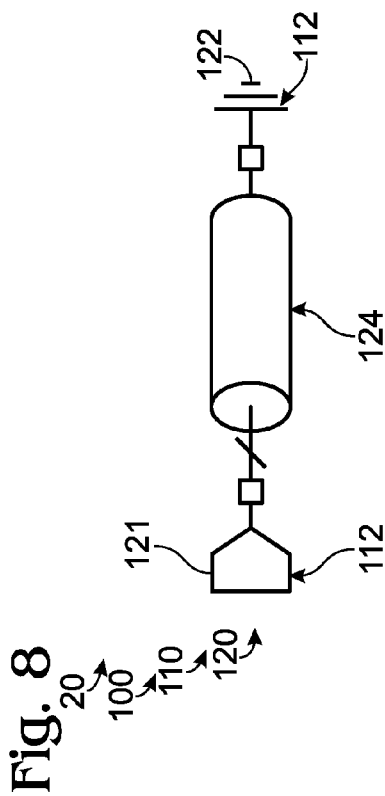
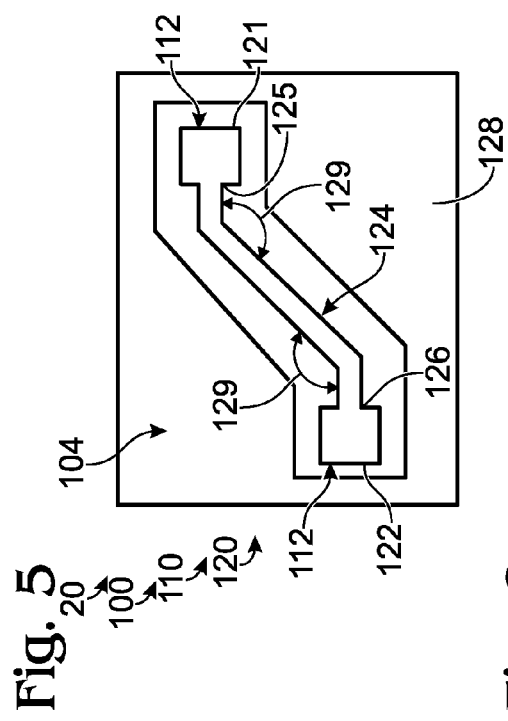
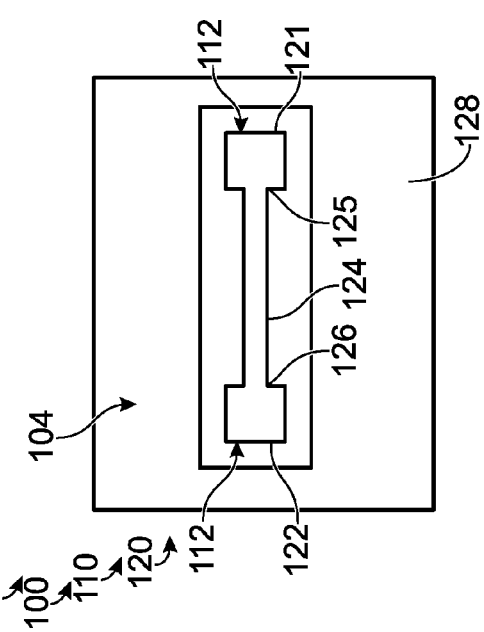

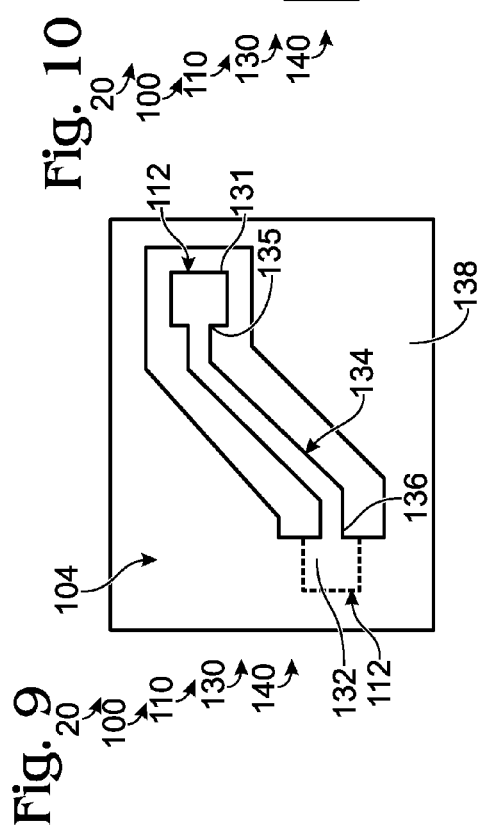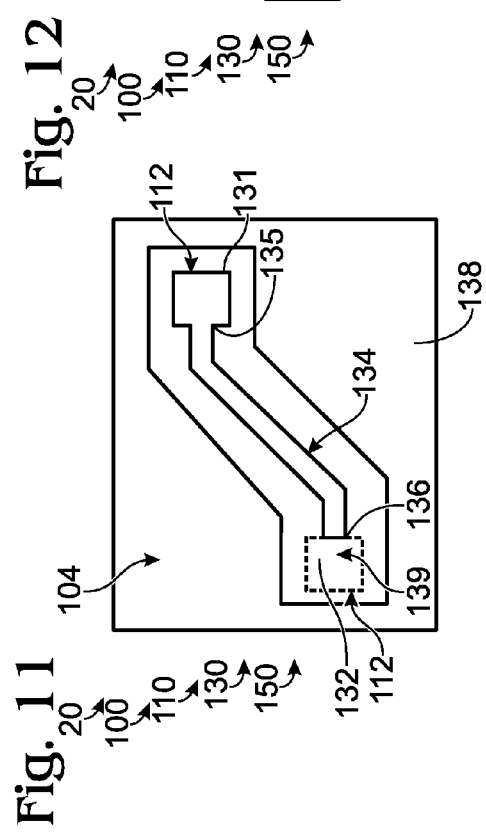

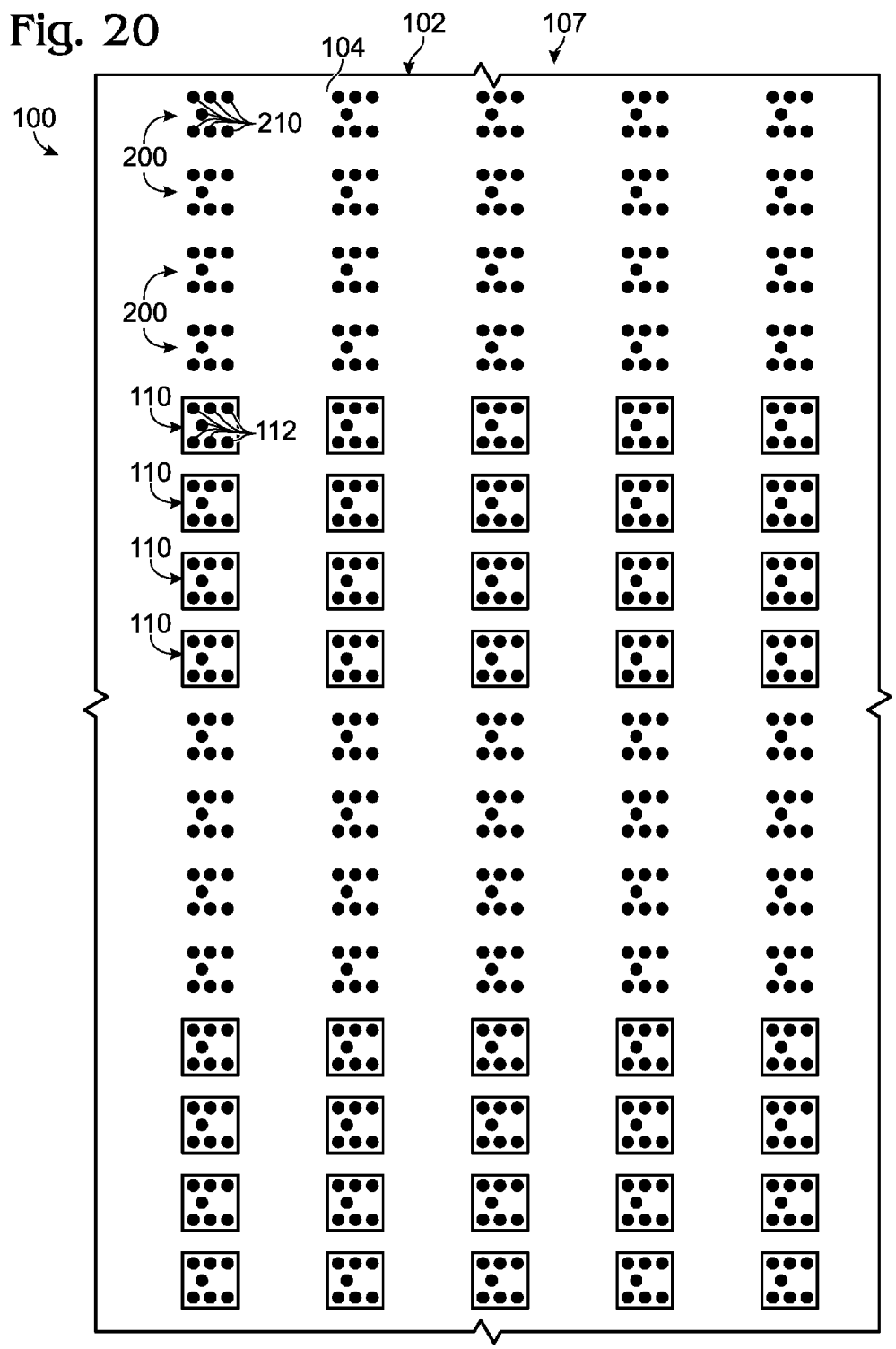

TEST STANDARDS AND METHODS FOR IMPEDANCE CALIBRATION OF A PROBE SYSTEM, AND PROBE SYSTEMS THAT INCLUDE THE TEST STANDARDS OR UTILIZE THE METHODS

FIELD OF THE DISCLOSURE

The present disclosure is directed to test standards and methods for impedance calibration of a probe system.

BACKGROUND OF THE DISCLOSURE

Probe systems often are utilized to test and/or quantify the operation of a device under test (DUT). Examples of such DUTs include semiconductor devices, integrated circuit devices, and/or integrated circuit chips. Prior to testing the DUT, the probe system often is calibrated. This calibration may be utilized to quantify the operation of the probe system, to verify the integrity of the probe system, and/or to permit more accurate characterization of the DUT. As an example, an impedance calibration may be performed on the probe system, and this impedance calibration may be utilized to mathematically separate the impedance characteristics of the probe system from the impedance characteristics of the DUT during testing of the DUT.

As DUTs become smaller, as testing methodologies are pushed to higher and higher accuracy and precision, and/or as power requirements of the DUTs decrease, it may be desirable to improve calibration equipment and/or methodologies. Thus, there exists a need for improved test standards and methods for impedance calibration of a probe system.

SUMMARY OF THE DISCLOSURE

Test standards and methods for impedance calibration of a probe system and probe systems that include the test standards and/or utilize the methods are disclosed herein. The test standards include at least one test structure. In some embodiments, the test standard further includes an alignment structure that is associated with the test structure. In these embodiments, the test structure includes a plurality of contact regions. The alignment structure is spaced-apart from the test structure and includes a plurality of alignment marks. A relative orientation of the plurality of alignment marks corresponds to a relative orientation of the plurality of contact regions, and a distance between each of the plurality of alignment marks and a corresponding one of the plurality of contact regions is at least substantially equal for each of the plurality of alignment marks.

In some embodiments, the test standards include a plurality of test structures. In some embodiments, the plurality of test structures includes a thin film thru test structure and a thin film offset test structure. In these embodiments, the thin film thru test structure includes a first thru contact pad, a second thru contact pad, and an elongate thru conductor. The elongate thru conductor includes a first thru conductor end, which is in electrical communication with the first thru contact pad, and a second thru conductor end, which is in electrical communication with the second thru contact pad. The elongate thru conductor has a thru conductor shape and a thru conductor impedance. The thin film offset test structure includes an offset contact pad, an offset contact region, and an elongate offset conductor. The elongate offset conductor includes a first offset conductor end, which is in electrical communication with the offset contact pad, and a second offset conductor end, which extends into physical contact with the offset contact region. The elongate offset conductor has an offset conductor shape, which corresponds to the thru conductor shape, and an offset conductor impedance, which corresponds to the thru conductor impedance.

In some embodiments, the plurality of test structures is positioned to simultaneously contact a plurality of probe regions of a probe head. In these embodiments, each of the plurality of test structures is positioned, relative to a remainder of the plurality of test structures, to contact a corresponding one of the plurality of probe regions. In addition, each of the plurality of test structures includes a first contact region, which is configured to contact a first probe tip of a corresponding one of the plurality of contact regions, and a second contact region, which is spaced-apart from the first contact region and configured to contact a second probe tip of the corresponding one of the plurality of contact regions. Each of the plurality of test structures further is configured to apply a predetermined test condition to the corresponding one of the plurality of probe regions.

The methods include methods of calibrating a probe system. The methods include aligning a probe head with a test standard and simultaneously contacting each probe region of the probe head with a corresponding test structure of the test standard. The methods further include applying a predetermined test condition to each probe region with the corresponding test structure.

BRIEF DESCRIPTION OF THE DRAWINGS

FIG. 5 is a schematic representation of a thin film thru test structure that may be utilized with the probe systems, test standards, and methods according to the present disclosure.

FIG. 6 is another schematic representation of a thin film thru test structure that may be utilized with the probe systems, test standards, and methods according to the present disclosure.

FIG. 7 is another schematic representation of a thin film thru test structure that may be utilized with the probe systems, test standards, and methods according to the present disclosure.

FIG. 8 is an equivalent circuit diagram of the thin film thru test structures of FIGS. 5-7.

FIG. 9 is a schematic representation of a thin film offset test structure, according to the present disclosure, in the form of a thin film offset short test structure.

FIG. 10 is an equivalent circuit diagram of the thin film offset short test structure of FIG. 9.

FIG. 11 is a schematic representation of a thin film offset test structure, according to the present disclosure, in the form of a thin film offset open test structure.

FIG. 12 is an equivalent circuit diagram of the thin film offset open test structure of FIG. 11.

FIG. 20 is another less schematic top view of a portion of a test standard according to the present disclosure.

DETAILED DESCRIPTION AND BEST MODE OF THE DISCLOSURE

Figure 1:
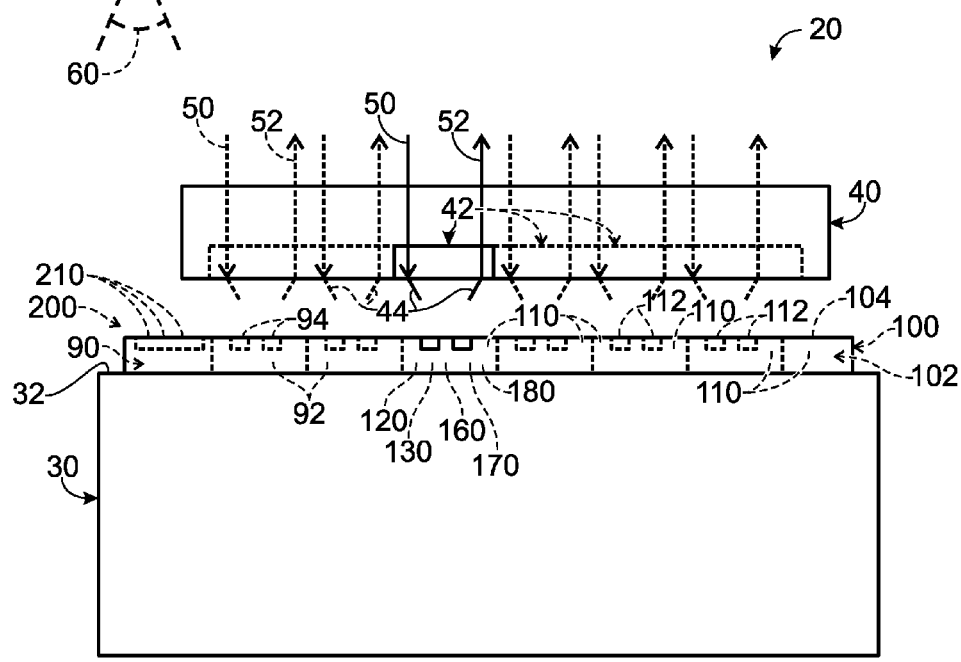
FIG. 1 is a schematic side view illustrating examples of probe systems according to the present disclosure.

FIGS. 1-21 provide examples of probe systems 20, of test standards 100, and/or of methods 300 according to the present disclosure. Elements that serve a similar, or at least substantially similar, purpose are labeled with like numbers in each of FIGS. 1-21, and these elements may not be discussed in detail herein with reference to each of FIGS. 1-21. Similarly, all elements may not be labeled in each of FIGS. 1-21, but reference numerals associated therewith may be utilized herein for consistency. Elements, components, and/or features that are discussed herein with reference to one or more of FIGS. 1-21 may be included in and/or utilized with any of FIGS. 1-21 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 2:
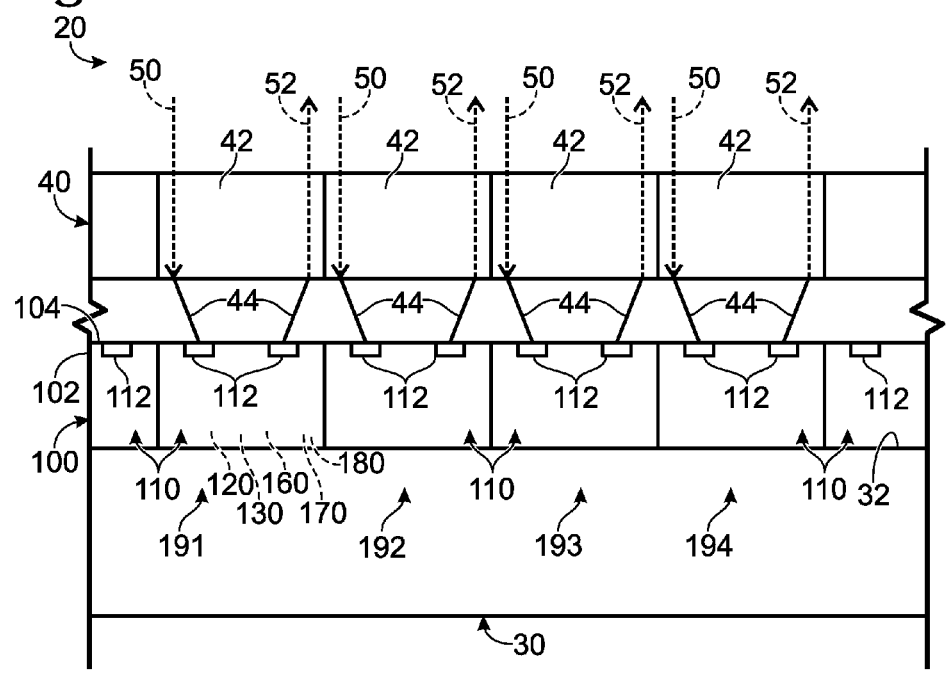
FIG. 2 is a schematic cross-sectional view illustrating examples of a probe head contacting test standards according to the present disclosure.
Figure 3:
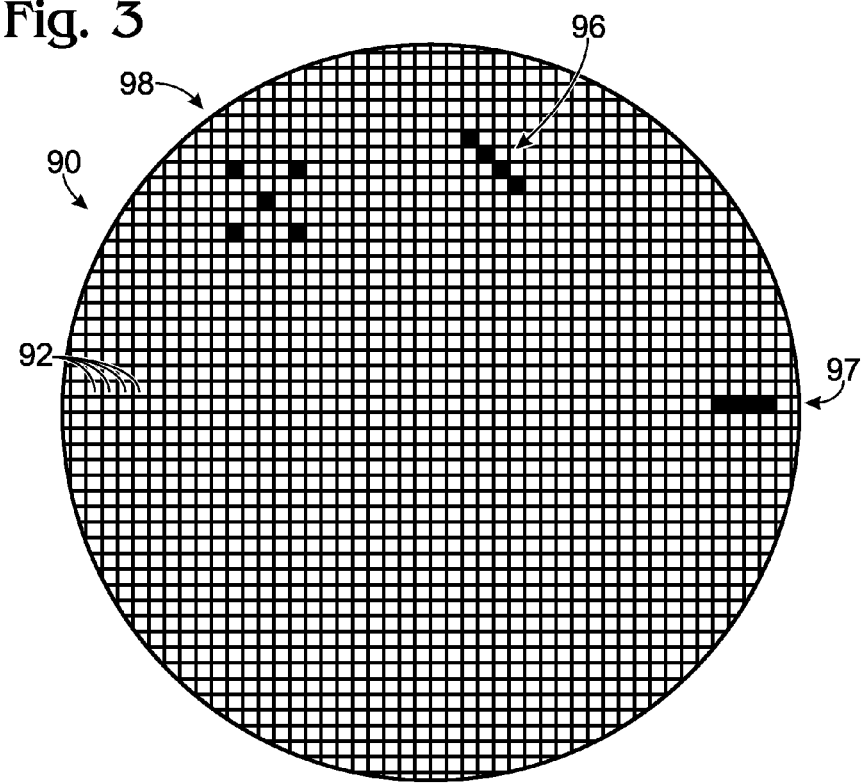
FIG. 3 is a schematic top view of a device substrate including a plurality of devices under test that may be tested by the probe system of FIG. 1.
Figure 4:
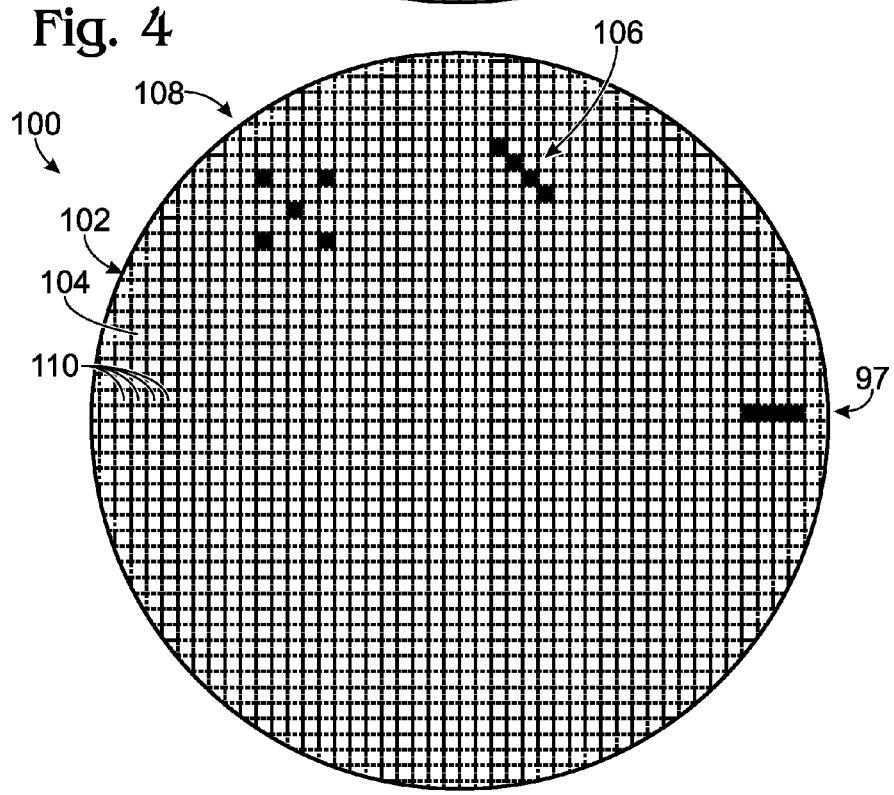
FIG. 4 is a schematic top view of a test standard including a plurality of test structures that may be utilized to calibrate the probe system of FIG. 1.

FIG. 1 is a schematic side view illustrating examples of probe systems 20 according to the present disclosure. FIG. 2 is a schematic cross-sectional view illustrating examples of a probe head 40 of probe system 20 contacting test standards 100 according to the present disclosure. FIG. 3 is a schematic top view of a device substrate 90 that includes a plurality of devices under test (DUTs) 92 that may be tested by the probe system of FIG. 1, while FIG. 4 is a schematic top view of a test standard 100 including a plurality of test structures 110 that may be utilized to calibrate the probe system of FIG. 1.

As illustrated in FIGS. 1-2, probe system 20 includes probe head 40, which may include one or more probe regions 42. Probe system 20 also includes a chuck 30, which includes a support surface 32. Support surface 32 is configured to support a device substrate 90 (as illustrated in FIG. 1), such as during testing of one or more DUTs 92 that may be present on device substrate 90. Support surface 32 alternatively may support test standard 100 (as illustrated in FIGS. 1-2). Test standard 100 may be utilized to calibrate probe system 20 prior to probe system 20 being utilized to test one or more devices under test 92 that may be present on device substrate 90. As an example, test standard 100 may be utilized for impedance calibration of probe system 20.

In some embodiments, probe system 20 may be configured to simultaneously test a plurality of DUTs 92. Under these conditions, probe head 40 may include a plurality of probe regions 42, and each of the plurality of probe regions may be positioned relative to a remainder of the plurality of probe regions to contact a corresponding one of the plurality of DUTs. As an example, each probe region 42 may include a plurality of probe tips 44, and probe tips 44 may be positioned to contact corresponding contact pads 94 of corresponding DUTs 92. During testing of DUTs 92, each probe tip 44 may convey a corresponding test signal 50 to corresponding contact pad 94 and/or may receive a corresponding resultant signal 52 from the corresponding contact pad.

When probe systems 20 include probe heads 40 with probe regions 42 that are configured to simultaneously contact a plurality of DUTs 92, test standards 100 according to the present disclosure similarly may be configured to simultaneously contact the plurality of contact regions. Stated another way, test standard 100 may include a plurality of test structures 110, and each of the plurality of test structures may be positioned relative to a remainder of the plurality of test structures to contact a corresponding one of the plurality of probe regions. Stated yet another way, the plurality of test structures 110 simultaneously may contact the plurality of probe regions 42 when the probe head is brought into contact with test standard 100. Such simultaneous contact places each probe region 42 in a known state, permits test standard 100 to contact each probe region 42 with a known test structure 110, and/or permits test standard 100 to apply a known and/or predetermined test condition to each contact region 42. This is illustrated in FIG. 2, where probe regions 42 of probe head 40 are contacting contact regions 112 of corresponding test structures 110 of test standard 100.

Such a correlation between a location of DUTs 92 on device substrate 90 and a location of test structures 110 on test standard 100 also is illustrated in FIGS. 3-4. As illustrated in FIG. 3, device substrate 90 may include a DUT array of DUTs 92, which may be arranged periodically, or in a repeating pattern, thereon. Similarly, and as illustrated in FIG. 4, test standard 100 may include a test structure array of test structures 110, and a relative orientation, or relative spacing, of the plurality of test structures on test standard 100 may correspond to a relative orientation, or relative spacing, of the plurality of DUTs on device substrate 90.

Test standard 100 may not have, and is not required to have, a test structure 110 at each location in the test structure array. Stated another way, the array of test structures 110 of test standard 100 may not have the same number of test structures as a number of DUTs in the array of DUTs 92 of device substrate 90. However, a relative orientation of test structures 110 corresponds to a relative orientation of DUTs 92 that simultaneously are contacted by probe head 40 during testing of DUTs 92. This may include any suitable relative orientation among test structures 110. As an example, and as illustrated in FIG. 3 at 96, probe regions 42 of probe head 40 of FIGS. 1-2 may be positioned to contact DUTs 92 in a diagonal pattern. Under these conditions, at least a subset of test structures 110 of test standard 100 may be arranged in a corresponding diagonal pattern 106, as illustrated in FIG. 4. As another example, and as illustrated in FIG. 3 at 97, probe regions 42 of probe head 40 of FIGS. 1-2 may be positioned to contact DUTs 92 in a linear pattern.

Under these conditions, at least a subset of test structures 110 of test standard 100 may be arranged in a corresponding linear pattern 107. As yet another example, and as illustrated in FIG. 3 at 98, probe regions 42 of probe head 40 of FIGS. 1-2 may be positioned to contact DUTs 92 in a cross pattern. Under these conditions, at least a subset of test structures 110 of test standard 100 may be arranged in a corresponding cross pattern 108, as illustrated in FIG. 4.

As a result of the contact between probe regions 42 and test structures 110, each test structure 110 applies a corresponding and/or predetermined test condition to the corresponding probe region 42. Stated another way, contact between the probe regions and the corresponding test structures places each of the probe regions in a known state and/or applies a known condition to each of the probe regions. This may include application of a first test condition to a first probe region via a first test structure, as indicated in FIG. 2 at 191, application of a second test condition to a second probe region via a second test structure, as indicated in FIG. 2 at 192, application of a third test condition to a third probe region via a third test structure, as indicated in FIG. 2 at 193, and/or application of a fourth test condition to a fourth probe region via a fourth test structure, as indicated in FIG. 2 at 194. Such a configuration may increase an accuracy of calibration of probe head 40 when compared to conventional test standards that do not contact each, or every, probe region 42 and therefore do not simultaneously apply a known test condition to each, or every, probe region 42.

It is within the scope of the present disclosure that probe system 20 may be configured to, or that calibration of probe system 20 may include, simultaneously providing a corresponding test signal 50 from each of the plurality of probe regions to the corresponding one of the plurality of test structures. However, this is not required, and one or more test structures 110 additionally or alternatively may apply the known test condition without receiving a test signal while one or more other test structures 110 receives a test signal.

Test signals 50, when applied, may include and/or be any suitable test signal, such as an electric current test signal, an electric voltage test signal, a digital test signal, a bit error test signal, an analog test signal, and/or a radio frequency, or RF, test signal. Similarly, resultant signals 52, when received, may include and/or be any suitable resultant signal, such as an electric current resultant signal, an electric voltage resultant signal, a digital resultant signal, a bit error resultant signal, an analog resultant signal, and/or a radio frequency, or RF, resultant signal.

It is within the scope of the present disclosure that probe head 40 may include any suitable number of probe regions 42. As examples, probe head 40 may include at least 2, at least 4, at least 6, at least 8, at least 10, at least 50, at least 100, at least 250, at least 500, at least 750, and/or at least 1000 probe regions 42, and each probe region 42 may be positioned to contact a separate, distinct, and/or spaced-apart DUT 92. Additionally or alternatively, probe head 40 may be configured for full, or full-wafer, contact with device substrate 90 and/or may include a probe region 42 for each DUT 92 that is present on device substrate 90.

Returning to FIG. 1, probe system 20 further may include an imaging device 60. Imaging device 60, when present, may be configured to view, observe, and/or image at least a portion of device substrate 90 and/or of test standard 100, such as to permit and/or facilitate alignment between probe head 40 and device substrate 90 and/or to permit and/or facilitate alignment between probe head 40 and test standard 100. As illustrated in FIG. 1, imaging device 60 may be positioned such that the imaging device images a portion of test standard 100 that is spaced-apart from test structures 110 that are contacted by probe region 42. As such, and as discussed in more detail herein, test standards 100 according to the present disclosure may include one or more alignment structures 200 that include one or more alignment marks 210. Alignment structures 200 may be oriented relative to test structures 110 to permit and/or facilitate alignment between probe regions 42 and test structures 110 without the need for imaging device 60 to image, or directly image, probe regions 42, probe tips 44, test structures 110, and/or contact regions 112.

As discussed, test standards 100, according to the present disclosure, such as test standards 100 of FIGS. 1-2 and 4, may include a plurality of test structures 110. Test structures 110 may be arranged on and/or within a test standard substrate 102 that defines a surface plane 104. As perhaps best illustrated in FIG. 2, each test structure 110 includes a first contact region 112, which is configured to contact a first probe tip 44 of a corresponding probe region 42, and a second contact region 112, which is spaced-apart from the first contact region and configured to contact a second probe tip 44 of corresponding probe region 42.

As also perhaps best illustrated in FIG. 2, each test structure 110 is configured to apply a corresponding predetermined test condition, such as first test condition 191, second test condition 192, third test condition 193, and/or fourth test condition 194, to corresponding probe region 42. The predetermined test condition may include, or be, any suitable test condition, examples of which include a short test condition, an open test condition, a load test condition, a thru test condition, and/or an offset test condition.

Examples of test structures 110 that may be included in test standards 100 and/or that may be utilized to apply these test conditions to probe regions 42 of probe heads 40 and/or of probe systems 20 are illustrated in FIGS. 5-18 and discussed in more detail herein with reference thereto. Any of the structures, functions, and/or features that are discussed herein with reference to test structures 110 of any of FIGS. 5-18 may be included in and/or utilized with probe systems 20 of FIGS. 1-2 and/or test standards 100 of FIGS. 1-2 and 4 without departing from the scope of the present disclosure. Similarly, any of the structures, functions, and/or features that are discussed herein with reference to probe systems 20 of FIGS. 1-2 and/or test standards 100 of FIGS. 1-2 and 4 may be included in and/or utilized with test structures 110 of FIGS. 5-18 without departing from the scope of the present disclosure.

It is within the scope of the present disclosure that test standards 100 and/or test structures 110 thereof may apply the same condition to each, or every, probe region 42 of a given probe head 40. Stated another way, the predetermined test condition may be the same test condition for each, or every, test structure 110 that simultaneously contacts probe regions 42 of probe head 40. As examples, each, or every, probe region 42 may have the short test condition, the open test condition, the load test condition, the thru test condition, and/or the offset test condition applied thereto. Stated another way, each, or every, test structure may be a short test structure 160, an open test structure 170, a load test structure 180, a thru test structure 120, or an offset test structure 130. Such a configuration may permit each probe region 42 to be placed in the same state and/or to be operated under the same conditions during calibration of probe head 40.

Additionally or alternatively, it is also within the scope of the present disclosure that a selected test structure 110 may apply a different test condition from a remainder of the test structures. Stated another way, the predetermined test condition of the selected test structure may be different from the predetermined test condition of the remainder of the test structures. As an example, the predetermined test condition of the selected test structure 110 may be one of the short test condition, the open test condition, the thru test condition, and the offset test condition, while the predetermined test condition of the remainder of the test structures may be the load test condition. Stated another way, the selected test structure may be the short test structure, the open test structure, the thru test structure, or the offset test structure, while the remainder of the test structures may be the load test structure. Such a configuration may permit the selected probe region to be tested while the remaining probe regions are maintained in known states, or conditions, during calibration of probe head 40.

FIGS. 5-18 provide less schematic examples of test structures 110 that may be included in and/or utilized with test standards 100, according to the present disclosure, and/or of equivalent circuit diagrams for test structures 110. Any of the test structures that are illustrated in any of FIGS. 5-18 may be included in and/or utilized with test standards 100 and/or probe systems 20, according to the present disclosure, including probe systems 20 of FIGS. 1-2 and/or test standards 100 of FIGS. 1-2, 4, and/or 19-20. In general, test structures 110, which are disclosed herein, may be formed on, may be defined on, may be formed within, and/or may extend within surface plane 104 of test standard substrate 102 of test standard 100, as illustrated in FIGS. 1-2 and 4. Such test structures 110 also may be referred to herein as, or may be, thin film test structures 110.

As discussed, test standards 100, according to the present disclosure, may include a thru test structure 120. FIGS. 5-7 are schematic representations of thru test structures 120 that may be utilized with probe systems 20, test standards 100, and/or methods 300 according to the present disclosure, while FIG. 8 is an equivalent circuit diagram of the thru test structures of FIGS. 5-7. Thru test structures 120 also may be referred to herein as thin film thru test structures 120 and may be one of a variety of test structures 110 that may be included in test standards 100 according to the present disclosure.

Thin film thru test structures 120 include a first contact region 112, in the form of a first thru contact pad 121, and a second contact region 112, in the form of a second thru contact pad 122. First thru contact pad 121 and second thru contact pad 122 each are configured to electrically contact corresponding probe tips of a probe head, such as probe tips 44 of probe head 40 of FIGS. 1-2, and are positioned relative to one another to permit such contacting. First thru contact pad 121 also may be referred to herein as an electrically conductive first thru contact pad 121, while second thru contact pad 122 also may be referred to herein as an electrically conductive second thru contact pad 122.

Thin film thru test structure 120 further includes an elongate thru conductor 124. Elongate thru conductor 124 also may be referred to herein as a thru conductor 124 and/or as a thru waveguide 124. Elongate thru conductor 124 includes a first thru conductor end, or end region, 125, which is in electrical communication with first thru contact pad 121, and second thru conductor end, or end region, 126, which is in electrical communication with second thru contact pad 122. Elongate thru conductor 124 has a thru conductor shape and a thru conductor impedance.

The thru conductor shape may include and/or be any suitable shape. As examples, the thru conductor shape may include interconnected linear regions, as illustrated in FIG. 5, may be linear, or rectangular, as illustrated in FIG. 6, may be arcuate, or U-shaped, as illustrated in FIG. 7, and/or may be nonlinear, as illustrated in FIGS. 5 and 7. When the thru conductor shape includes interconnected linear regions, the linear regions may intersect at an angle of intersection 129, as illustrated in FIG. 5. Examples of the angle of intersection include angles of at least 90 degrees, at least 95 degrees, at least 100 degrees, at least 105 degrees, at least 110 degrees, at least 115 degrees, at least 120 degrees, at least 125 degrees, at least 130 degrees, at least 135 degrees, and/or at least 140 degrees. Additionally or alternatively, the angle of intersection may be at most 270 degrees, at most 260 degrees, at most 250 degrees, at most 240 degrees, at most 230 degrees, at most 220 degrees, at most 210 degrees, at most 200 degrees, at most 190 degrees, at most 180 degrees, at most 175 degrees, at most 170 degrees, at most 165 degrees, at most 160 degrees, at most 155 degrees, at most 150 degrees, at most 145 degrees, at most 140 degrees, at most 135 degrees, and/or at most 130 degrees.

FIGS. 5-7 illustrate thru conductor 124 in two-dimensions. However, it is to be understood that the thru conductor is a three-dimensional object, with the third dimension extending into the plane of FIGS. 5-7. With this in mind, the thru conductor shape may describe the thru conductor in three, or in all three, dimensions.

The thru conductor impedance may have any suitable value. As an example, the thru conductor impedance may be 50 ohms, or nominally 50 ohms; however, this specific thru conductor impedance is not required. As examples, the thru conductor impedance may be greater than 50 ohms or less than 50 ohms.

The thru conductor may define a thru conductor length. The thru conductor length may be measured along a longitudinal length of the thru conductor and between the first thru conductor end and the second thru conductor end. An example of the thru conductor length is 1000 micrometers, or nominally 1000 micrometers; however, this specific thru conductor length is not required. As examples, the thru conductor length may be greater than 1000 micrometers or less than 1000 micrometers.

As also illustrated in FIGS. 5-7, thin film thru test structure 120 further may include a conductive thru ground plane 128. Conductive thru ground plane 128 may extend within surface plane 104 of test substrate 100. In addition, the conductive thru ground plane may extend around, and be spaced-apart from, the first thru contact pad, the second thru contact pad, and the thru conductor.

As shown in FIG. 8, thin film thru test structure 120 may be illustrated and/or modeled by an equivalent circuit that includes first thru contact pad 121, second thru contact pad 122, and elongate thru conductor 124. Elongate thru conductor 124 extends between and electrically interconnects the first thru contact pad and the second thru contact pad.

As also discussed, test standards 100, according to the present disclosure, may include an offset test structure 130. FIG. 9 is a schematic representation of an offset test structure 130, according to the present disclosure, in the form of an offset short test structure 140, while FIG. 10 is an equivalent circuit diagram of the offset short test structure of FIG. 9. FIG. 11 is a schematic representation of an offset test structure 130, according to the present disclosure, in the form of an offset open test structure 150, while FIG. 12 is an equivalent circuit diagram of the offset open test structure of FIG. 11. Offset test structures 130 may be utilized with probe systems 20, test standards 100, and/or methods 300 according to the present disclosure. Stated another way, offset test structures 130 may be one of a variety of test structures 110 that may be included in test standards 100 according to the present disclosure.

Offset test structures 130 also may be referred to herein as thin film offset test structures 130 and may extend within surface plane 104 of test standard 100. The offset test structures may include two contact regions 112 including an offset contact pad 131 and an offset contact region 132. Offset contact pad 131 may be positioned to electrically contact the first probe tip of a given probe region. Offset contact region 132 may be positioned relative to offset contact pad 131 to electrically contact the second probe tip of the given probe region. Stated another way, a relative orientation between offset contact pad 131 and offset contact region 132 may be similar, at least substantially similar, or even identical, to the relative orientation between first thru contact pad 121 and second thru contact pad 122 of thru test structures 120 of FIGS. 5-8.

Offset contact pad 131 may be similar, at least substantially similar, or even identical to first thru contact pad 121 of thin film thru test structure 120 of FIGS. 5-8. However, offset contact region 132 may differ from second thru contact pad 122 in at least one respect. As an example, and as illustrated in FIG. 9 and discussed in more detail herein, offset contact region 132 may be in electrical communication with and/or may form a portion of a conductive offset ground plane 138 of the thin film offset test structure. As another example, and as illustrated in FIG. 11 and discussed in more detail herein, offset contact region 132 may be defined by and/or within an electrically insulating region 139.

As further illustrated in FIGS. 9-12, thin film offset test structures 130 also include an elongate offset conductor 134. Elongate offset conductor 134 extends between a first offset conductor end 135 and a second offset conductor end 136. The first offset conductor end is in electrical communication with offset contact pad 131. The second offset conductor end extends into physical contact with offset contact region 132.

Elongate offset conductor 134 also may be referred to herein as an offset conductor 134 and/or as an offset waveguide 134. The elongate offset conductor has an offset conductor shape, an offset conductor impedance, and/or an offset conductor length. In some embodiments of test standards 100, according to the present disclosure, that include one or more thru test structures 120 of FIGS. 5-8 and that also include one or more offset test structures 130 of FIGS. 9-12, the offset conductor shape may correspond to the thru conductor shape. As examples, the offset conductor shape may be similar to the thru conductor shape, may be at least substantially similar to the thru conductor shape, may be identical to the thru conductor shape, may be at least substantially identical to the thru conductor shape, and/or may be patterned, or intended, to be identical to the thru conductor shape. Examples of the offset conductor shape are disclosed herein with reference to the thru conductor shape.

Similarly, the offset conductor impedance may correspond to the thru conductor impedance. As examples, the offset conductor impedance may be similar to the thru conductor impedance, may be at least substantially similar to the thru conductor impedance, may be identical to the thru conductor impedance, may be at least substantially identical to the thru conductor impedance, and/or may be patterned, or intended, to be identical to the thru conductor impedance. An example of the offset conductor impedance is disclosed herein with reference to the thru conductor impedance. As a more specific example, the offset conductor impedance may be matched to the thru conductor impedance to within a threshold impedance difference. Examples of the threshold impedance difference include impedance differences of less than 20%, less than 15%, less than 10%, less than 5%, less than 4%, less than 3%, less than 2%, less than 1%, less than 0.5%, less than 0.1%, less than 0.05%, and/or less than 0.01% of the thru conductor impedance.

The offset conductor length also may correspond to the thru conductor length. As examples, the offset conductor length may be similar to the thru conductor length, may be at least substantially similar to the thru conductor length, may be identical to the thru conductor length, may be at least substantially identical to the thru conductor length, and/or may be patterned, or intended, to be identical to the thru conductor length. An example of the offset conductor length is disclosed herein with reference to the thru conductor length. As a more specific example, the offset conductor length may be matched to the thru conductor length to within a threshold length difference. Examples of the threshold length difference include length differences of less than 2%, less than 1%, less than 0.5%, less than 0.1%, less than 0.05%, less than 0.01%, less than 0.005%, and/or less than 0.001% of the thru conductor length.

As also illustrated in FIGS. 9 and 11, thin film offset test structure 130 further may include conductive offset ground plane 138. Conductive offset ground plane 138 may extend within surface plane 104 of test substrate 100. In addition, the conductive offset ground plane may extend around, or entirely around, and be spaced-apart from, offset contact pad 131 and/or at least a portion of offset conductor 134 within surface plane 104.

As discussed, and as illustrated in FIGS. 9-10, offset test structures 130 according to the present disclosure may include, or be, an offset short test structure 140, which also may be referred to herein as a thin film offset short test structure 140. In thin film offset short test structure 140, offset contact region 132 may be defined by a portion of conductive ground plane 138 that is in electrical communication with second offset conductor end 136 of offset conductor 134. In such a configuration, offset conductor 134 may electrically short offset contact pad 131 to offset contact region 132 and/or to conductive offset ground plane 138.

As illustrated in FIG. 10, the equivalent circuit diagram for offset short test structure 140 may include offset contact pad 131, elongate offset conductor 134, an offset short inductor 141, and offset contact region 132. Elongate offset conductor 134 and offset short inductor 141 may be connected in series and may electrically interconnect offset contact pad 131 with offset contact region 132. As discussed, elongate offset conductor 134 may be similar, or even identical, to elongate thru conductor 124 of FIGS. 5-8.

As discussed, and as illustrated in FIGS. 11-12, offset test structures 130 according to the present disclosure may include, or be, an offset open test structure 150, which also may be referred to herein as a thin film offset open test structure 150. In thin film offset open test structure 150, offset contact region 132 may be defined by electrically insulating region 139 and/or may electrically isolate a probe tip that contacts the offset contact region from elongate offset conductor 134 and/or from conductive offset ground plane 138. Under these conditions, conductive offset ground plane 138 may surround electrically insulating region 139 within surface plane 104.

As illustrated in FIG. 12, the equivalent circuit diagram for offset open test structure 150 may include offset contact pad 131, elongate offset conductor 134, an offset open capacitor 151, and offset contact region 132. Elongate offset conductor 134 and offset open capacitor 151 may be connected in series, may be in electrical communication with offset contact pad 131, and may extend between offset contact pad 131 and offset contact region 132. As discussed, elongate offset conductor 134 may be similar, or even identical, to elongate thru conductor 124 of FIGS. 5-8.

Figure 13:
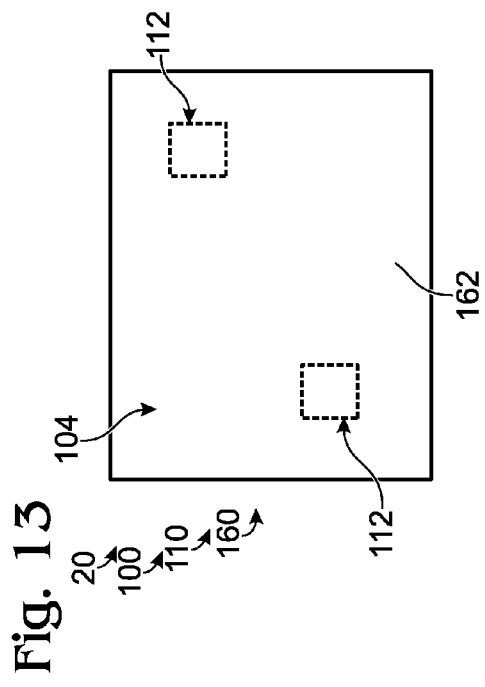
FIG. 13 is a schematic representation of a thin film short test structure that may be utilized with the probe systems, test standards, and methods according to the present disclosure.
Figure 14:
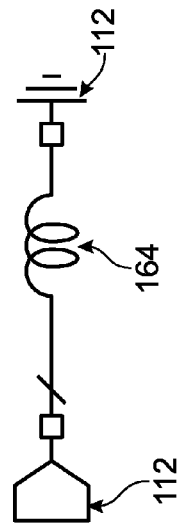
FIG. 14 is an equivalent circuit diagram of the thin film short test structure of FIG. 13.

As discussed, test standards 100, according to the present disclosure, may include a short test structure 160. FIG. 13 is a schematic representation of short test structure 160 that may be utilized with probe systems 20, test standards 100, and/or methods 300 according to the present disclosure, while FIG. 14 is an equivalent circuit diagram of the short test structure of FIG. 13. Short test structure 160 also may be referred to herein as a thin film short test structure 160 and may be one of a variety of test structures 110 that may be included in test standards 100 according to the present disclosure.

Short test structure 160 may extend within surface plane 104 of the test standard substrate and may be configured to electrically interconnect, or short, the first probe and the second probe when the first probe and the second probe electrically contact the test structure. An example of short test structure 160 includes an electrically conductive film 162 that extends within surface plane 104. Electrically conductive film 162 includes and/or defines contact regions 112 of short test structure 160.

As illustrated in FIG. 14, the equivalent circuit diagram for short test structure 160 may include two electrically conductive contact regions 112 and a short inductor 164. Short inductor 164 extends between and electrically interconnects the two electrically conductive contact regions 112.

Figure 15:
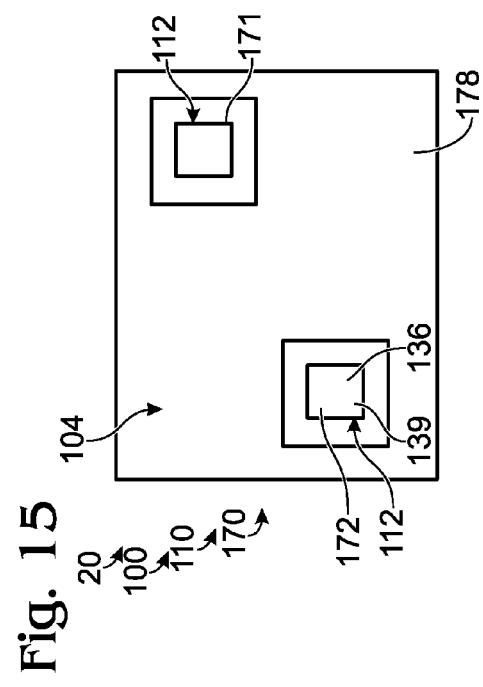
FIG. 15 is a schematic representation of a thin film open test structure that may be utilized with the probe systems, test standards, and methods according to the present disclosure.
Figure 16:
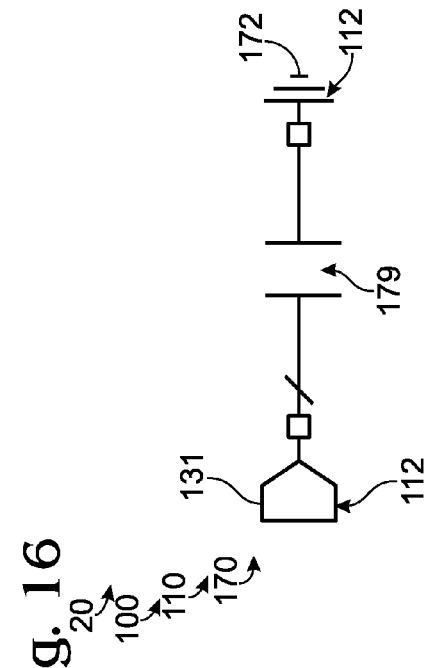
FIG. 16 is an equivalent circuit diagram of the thin film open test structure of FIG. 15.

As discussed, test standards 100, according to the present disclosure, may include an open test structure 170. FIG. 15 is a schematic representation of open test structure 170 that may be utilized with probe systems 20, test standards 100, and/or methods 300 according to the present disclosure, while FIG. 16 is an equivalent circuit diagram of the open test structure of FIG. 15. Open test structure 170 also may be referred to herein as a thin film open test structure 170 and may be one of a variety of test structures 110 that may be included in test standards 100 according to the present disclosure.

Open test structure 170 may extend within surface plane 104 of the test standard substrate and may be configured to electrically isolate the first probe from the second probe when the first probe and the second probe electrically contact the open test structure. As illustrated in FIG. 15, open test structure 170 may include two contact regions 112 in the form of a first open contact pad 171 and a second open contact pad 172. The open test structure further includes an electrically conductive open ground plane 178 that extends around and is spaced-apart from the first open contact pad and also from the second open contact pad within surface plane 104.

As illustrated in FIG. 16, the equivalent circuit diagram for open test structure 170 may include two electrically conductive contact regions 112, in the form of first open contact pad 171 and second open contact pad 172, and an open capacitor 179. Open capacitor 179 extends between and electrically interconnects the two electrically conductive contact regions 112.

Figure 17:
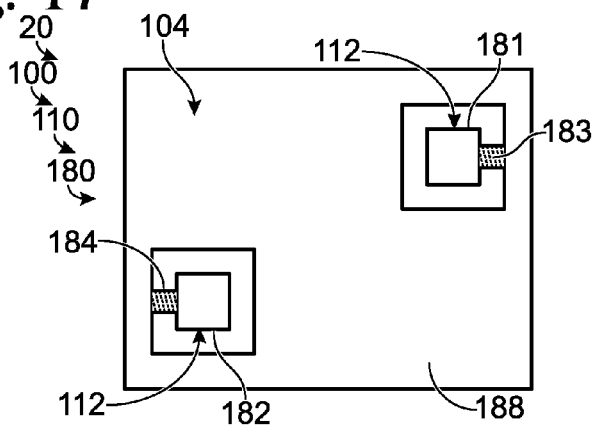
FIG. 17 is a schematic representation of a thin film load test structure that may be utilized with the probe systems, test standards, and methods according to the present disclosure.
Figure 18:
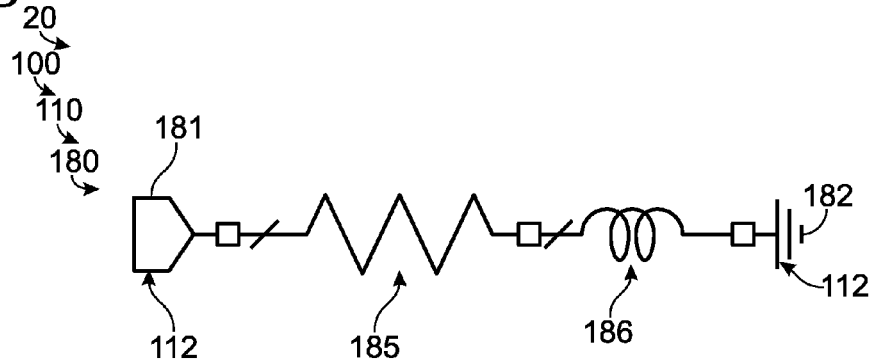
FIG. 18 is an equivalent circuit diagram of the thin film load test structure of FIG. 17.

As discussed, test standards 100, according to the present disclosure, may include a load test structure 180. FIG. 17 is a schematic representation of load test structure 180 that may be utilized with probe systems 20, test standards 100, and/or methods 300 according to the present disclosure, while FIG. 18 is an equivalent circuit diagram of the load test structure of FIG. 17. Load test structure 180 also may be referred to herein as a thin film load test structure 180 and may be one of a variety of test structures 110 that may be included in test standards 100 according to the present disclosure.

Load test structure 180 may extend within surface plane 104 of the test standard substrate and may be configured to apply a predetermined resistance, load, or electrical load between the first probe and the second probe when the first probe and the second probe electrically contact the load test structure. As illustrated in FIG. 17, load test structure 180 may include two contact regions 112 in the form of a first load contact pad 181 and a second load contact pad 182. The first load contact pad may be positioned to contact the first probe, while the second load contact pad may be positioned to contact the second probe. The load test structure further includes an electrically conductive load ground plane 188 that extends around and is spaced-apart from the first load contact pad and the second load contact pad. The load test structure also includes a first resistive element 183 and a second resistive element 184. The first resistive element extends in electrical communication with both the first load contact pad and the electrically conductive load ground plane. Similarly, the second resistive element extends in electrical communication with both the second load contact pad and the electrically conductive load ground plane.

As illustrated in FIG. 18, the equivalent circuit diagram for load test structure 180 may include two electrically conductive contact regions 112, in the form of first load contact pad 181 and second load contact pad 182, a load resistor 185, and a load inductor 186. Load resistor 185 and load inductor 186 are connected in series and electrically interconnect the first load contact pad and the second load contact pad.

Returning to FIGS. 1-2 and 4, an example of a test standard 100, according to the present disclosure, may include a plurality of test structures 110. The plurality of test structures 110 may include one or more thru test structures 120, such as the thru test structures that are discussed herein with reference to FIGS. 5-8, and one or more offset test structures 130, such as offset short test structures 140 that are discussed herein with reference to FIGS. 9-10 and/or offset open test structures 150 that are discussed herein with reference to FIGS. 11-12. In one embodiment, the test standard may include at least one thru test structure 120, a first offset test structure 130, in the form of an offset short test structure 140, and a second offset test structure 130, in the form of an offset open test structure 150.

When test standard 100 includes both thru test structure 120 and one or more offset test structures 130, and as discussed, elongate offset conductor 134 of the one or more offset test structures may be similar, or at least substantially similar, to elongate thru conductor 124 of the thru test structure. As examples, and as also discussed, the offset conductor shape of the elongate offset conductor may correspond to the thru conductor shape of the elongate thru conductor, the offset conductor impedance of the elongate offset conductor may correspond to the thru conductor impedance of the elongate thru conductor, and/or the offset conductor length of the elongate offset conductor may correspond to the thru conductor length of the elongate thru conductor.

Test standards 100 that include thru test structure 120 and one or more offset test structures 130 also may include one or more corresponding test structures that correspond to the one or more offset test structures. As an example, and when the one or more offset test structures includes offset short test structure 140, test standard 100 further may include a short test structure, such as short test structure 160 of FIGS. 13-14. As another example, and when the one or more offset test structures includes offset open test structure 150, test standard 100 further may include an open test structure, such as open test structure 170 of FIGS. 15-16. As yet another example, and when the one or more offset test structures includes both offset short test structure 140 and offset open test structure 150, test standard 100 further may include both the short test structure and the open test structure.

Such a configuration may provide several benefits over conventional test standards that do not include the above-described correspondence between the thru conductor of the thru test structure and the offset conductor of the offset test structure. As an example, the correspondence between the characteristics of the offset test structure and the thru test structure may permit the behavior of the offset test structure to be estimated, modeled, and/or predicted without the need for time-consuming and/or processing-intensive simulations. This may permit the operation and/or calibration of a probe system to be verified simply by measuring the thru test structure, the offset test structure, and the corresponding test structure for the offset test structure and then comparing the measured behavior of the offset test structure to the expected behavior of the offset test structure.

As another example, the ground planes of test structures 110 according to the present disclosure, such as electrically conductive thru ground plane 128, electrically conductive offset ground plane 138, electrically conductive open ground plane 178, and/or electrically conductive load ground plane 188 may be the same, or at least substantially the same, size as DUTs 92, which probe head 40 is configured to test, as measured within surface plane 104 of test standard 100. Such a configuration may improve the calibration that is obtained by test structures 110 when compared to conventional test structures that do not include ground planes that are the same size as the corresponding DUTs.

As a more specific example, measurement of the characteristics of the short test structure and the thru test structure may permit estimation of the characteristics of the offset short test structure, and the operation and/or calibration of the probe system may be verified by comparing the estimated characteristics of the offset short test structure to the measured characteristics of the offset short test structure. As another more specific example, measurement of the characteristics of the open test structure and the thru test structure may permit estimation of the characteristics of the offset open test structure, and the operation and/or calibration of the probe system may be verified by comparing the estimated characteristics of the offset open test structure to the measured characteristics of the offset open test structure.

Figure 19:
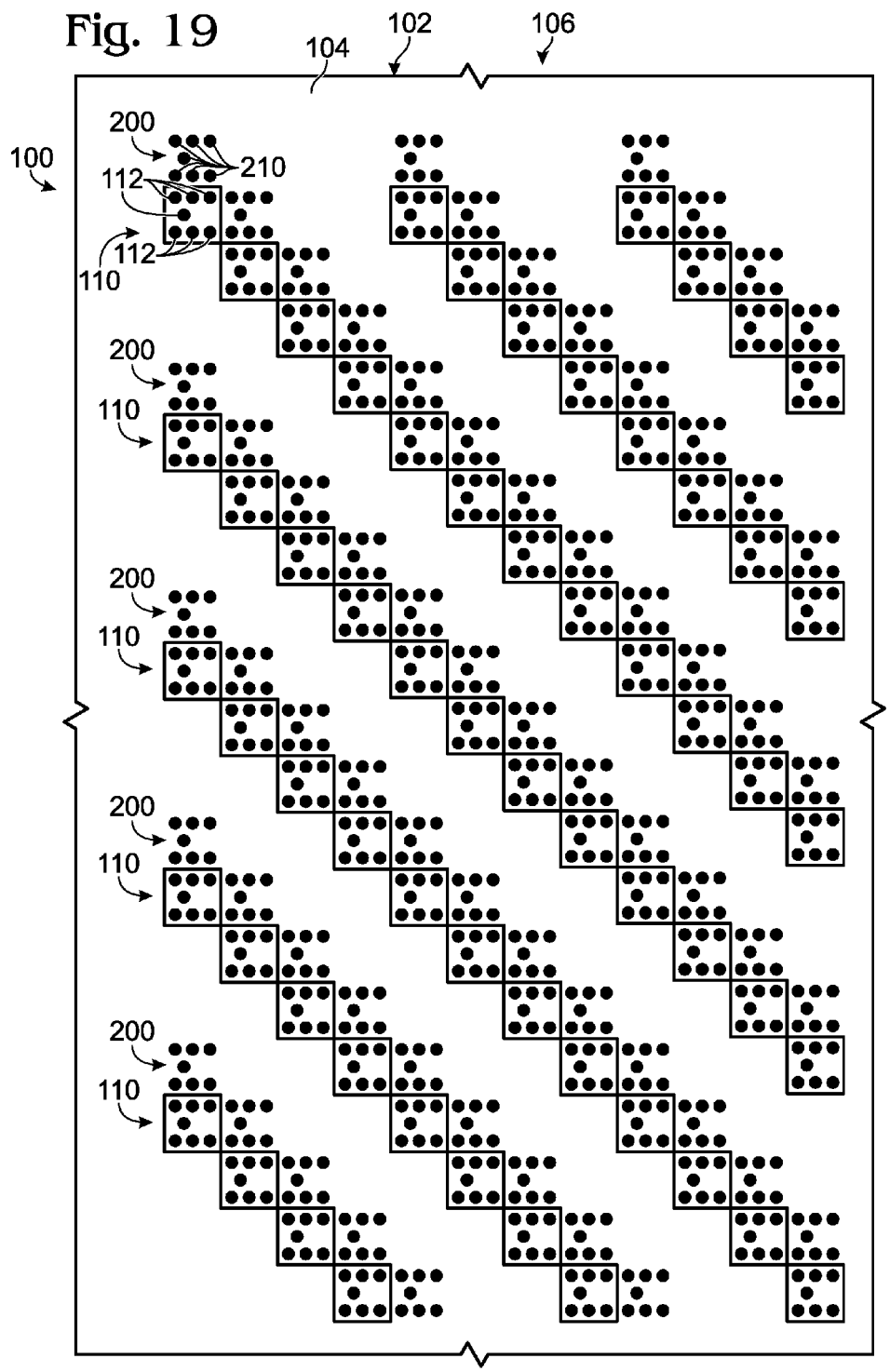
FIG. 19 is a less schematic top view of a portion of a test standard according to the present disclosure.

As discussed herein with reference to FIG. 1, test standards 100, according to the present disclosure, may include an alignment structure 200; and FIGS. 19-20 are less schematic top views of portions of test standards 100, according to the present disclosure, that may include alignment structures 200. As illustrated, test standards 100 may include one or more test structures 110, and each test structure 110 may include a plurality of contact regions 112. As discussed herein with reference to FIGS. 1-2, a relative orientation of the plurality of contact regions may correspond to a relative orientation of a plurality of probe tips of a probe head that the test standard is configured to calibrate. As such, and when the probe head is brought into contact with the test standard, each of the plurality of probe tips contacts a corresponding one of the plurality of contact regions.

Alignment structure 200, when present, may be spaced-apart from test structure 110 and may include one or more, or a plurality of, alignment marks 210. Alignment marks 210 may be positioned relative to one another such that a relative orientation of the plurality of alignment marks corresponds to, or is matched to, the relative orientation of the plurality of contact regions. In addition, alignment marks 210 also may be positioned relative to contact regions 112 such that a distance between each of the plurality of alignment marks and a corresponding one of the plurality of contact regions is equal, or substantially equal, to a distance between each other of the plurality of alignment marks and each other corresponding one of the plurality of contact regions.

It is within the scope of the present disclosure that test standard 100 may include a corresponding alignment mark for each contact region 112 of each test structure 110. As an example, and as illustrated in FIGS. 19-20, each test structure 110 may include a selected number of contact regions 112, such as 7 contact regions 112, and each alignment structure 200 may include the same number of alignment marks 210. However, this is not required, and alignment structure 200 may include any suitable number of alignment marks 210. As examples, each alignment structure 200 may include at least 2, at least 3, at least 4, at least 5, at least 6, or at least 7 alignment marks 210. Additionally or alternatively, alignment structure 200 may include at most 10, at most 8, at most 6, at most 4, or at most 2 alignment marks 210.

Test structure 110 and alignment structure 200, when present, may be coplanar, or at least substantially coplanar, with one another. As an example, at least a portion of both the test structure and the alignment structure may extend within, or at least substantially within, a surface plane 104 of a test standard substrate 102 that supports the test structure and the alignment structure.

Alignment structure 200 and/or alignment marks 210 thereof may be formed from an alignment mark material that contrasts, or optically contrasts, with test standard substrate 102. Such a configuration may permit optical detection of alignment marks 210 and/or of a location thereof, such as by imaging device 60 of FIG. 1. As examples, alignment marks 210 may be formed from an optically reflective material and/or from an optical absorptive material. As a more specific example, alignment marks 210 may be formed from a nickel alloy, from a nickel chromium alloy, and/or from a nickel chromium aluminum alloy.

As illustrated in FIGS. 19-20, test standards 100 may include a plurality of test structures 110 and a corresponding plurality of alignment structures 200. Stated another way, test standards 100 may include an alignment structure 200 for each test structure 110, with each alignment structure 200 including a corresponding plurality of alignment marks 210. In addition, each of the alignment structures may be associated with a corresponding one of the test structures. Stated another way, each of the alignment structures may be configured to facilitate alignment between the probe head and the corresponding one of the test structures.

Under these conditions, each of the alignment structures may be spaced-apart from the corresponding test structure and may include a plurality of alignment marks 210, with a location and/or relative orientation of the alignment marks corresponding to a location and/or relative orientation of contact regions 112 of the corresponding test structure. Furthermore, a distance between each of the alignment structures and the corresponding one of the test structures may be equal, or at least substantially equal, to a distance between each other of the alignment structures and each other corresponding test structure.

As discussed herein with reference to FIGS. 1-4, test standards 100, according to the present disclosure, may be configured to simultaneously contact probe tips 44 of a plurality of probe regions 42 of a probe head 40 that forms a portion of a probe system 20. Thus, and as also discussed, a relative orientation among test structures 110 of test standards 100 may correspond to a relative orientation of probe regions 42 of probe heads 40. This is illustrated in FIGS. 19-20, with FIG. 19 illustrating a diagonal pattern 106 for test structures 110 and FIG. 20 illustrating a linear pattern 107 for test structures 110.

Figure 21:
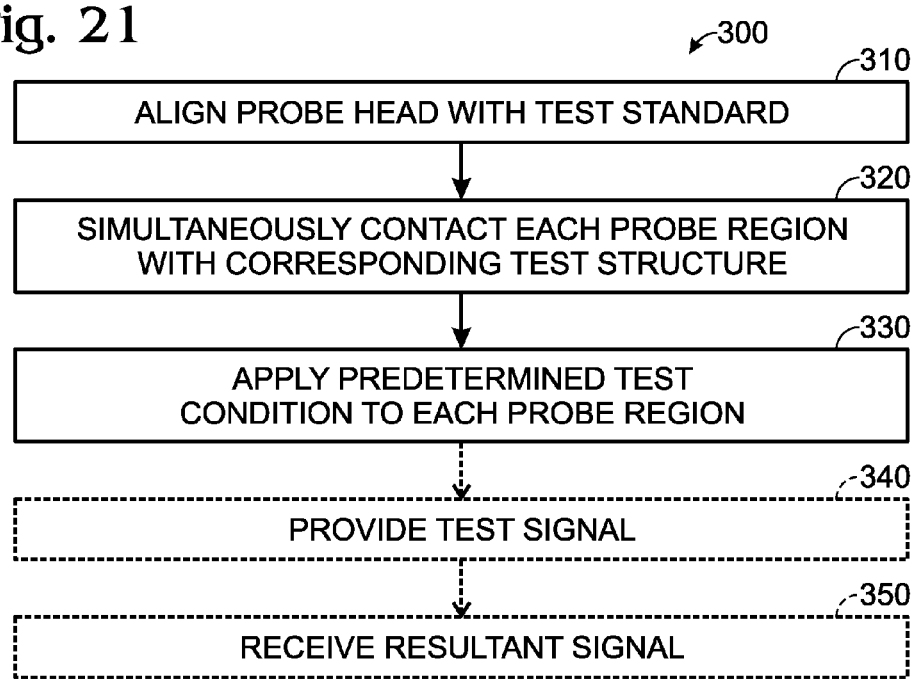
FIG. 21 is a flowchart depicting methods, according to the present disclosure, of calibrating a probe system.

FIG. 21 is a flowchart depicting methods 300, according to the present disclosure, of calibrating a probe system. The probe system may include a probe head, such as probe head 40 of FIGS. 1-2, that is configured to simultaneously contact a plurality of devices under test (DUTs), such as DUTs 92 of FIGS. 1-2. The probe head includes a plurality of probe regions, such as probe regions 42 of FIGS. 1-2. Each probe region may be positioned, relative to the other probe regions, to contact a corresponding one of the plurality of DUTs.

Methods 300 include aligning the probe head with a test standard at 310, simultaneously contacting each probe region of the probe head with a corresponding test structure of the test standard at 320, and applying a predetermined test condition to each probe region of the probe head at 330. Methods 300 further may include providing a test signal at 340 and/or receiving a resultant signal at 350.

Aligning the probe head with the test standard at 310 may include aligning in any suitable manner. As an example, the test standard may include a plurality of test structures, and the aligning at 310 may include aligning each probe region of the probe head with a corresponding test structure of the test standard. As another example, the aligning at 310 may include aligning the probe head and the test standard relative to one another in a direction that is parallel, or at least substantially parallel, to a surface plane of a test standard substrate that includes the test standard, such as surface plane 104 of FIGS. 1-2 and 4-20. As yet another example, each probe region may include a plurality of probe tips, such as probe tips 44 of FIGS. 1-2, and each test structure may include a plurality contact regions, such as contact regions 112 of FIGS. 1-2 and 4-20. Under these conditions, the aligning at 310 may include aligning the plurality of probe tips of each probe region with corresponding contact regions of corresponding test structures. As another example, the aligning at 310 may include moving the probe head and the test standard relative to one another, such as by moving the probe head and/or by moving the test standard.

It is within the scope of the present disclosure that the test standard further may include an alignment structure, such as alignment structure 200 of FIGS. 1 and 19-20, that is spaced apart from the test structures. Under these conditions, the aligning at 310 may include observing the alignment structure during the aligning and/or utilizing the alignment structure to accomplish and/or facilitate the aligning. The observing may include observing with and/or utilizing an imaging device, such as imaging device 60 of FIG. 1.

Simultaneously contacting each probe region of the probe head with the corresponding test structure of the test standard at 320 may include establishing electrical contact between each probe region and the corresponding test structure. This may include establishing electrical communication between a number of probe regions and a corresponding number of test structures. Examples of the number of probe regions and/or of the number of test structures include at least 2, at least 4, at least 6, at least 8, at least 10, at least 50, at least 100, at least 250, at least 500, at least 750, and/or at least 1000 probe regions and/or test structures. This also may include establishing electrical contact between probe tips of each of the probe regions and contact regions of each of the test structures.

The simultaneously contacting at 320 may be accomplished in any suitable manner. As an example, the simultaneously contacting at 320 may include moving the probe head toward the test standard and/or moving the test standard toward the probe head. This may include moving the test standard and/or the probe head in a direction that is perpendicular, or at least substantially perpendicular, to the surface plane of the test standard substrate.

As used herein, the phrase, "simultaneously contacting" should be interpreted to mean that, at a given point in time, such as during the applying at 330, during the providing at 340, and/or during the receiving at 350, each probe region is in electrical contact, or communication, with the corresponding test structure. The phrase, "simultaneously contacting" does not require, and should not be interpreted to require, that the electrical contact between each probe region and the corresponding test structure is simultaneously initiated.

Each test structure may be spaced-apart and/or separate from each other test structure. Additionally or alternatively, each test structure may be electrically isolated from each other test structure. As such, the phrase "simultaneously contacting" generally does not include contacting each probe region of the probe head with a single and/or with a continuous electrically conductive sheet, film, and/or layer but instead includes contacting the probe regions with respective, discrete, and/or spaced-apart test structures.

Applying the predetermined test condition to each probe region of the probe head at 330 may include applying the predetermined test condition with the corresponding test structure, such as the test structure that was contacted during the simultaneously contacting at 320. The applying at 330 may include applying any suitable test condition utilizing any suitable test structure, such as test structures 110 that are disclosed herein.

As an example, the applying at 330 may include applying a short test condition, such as via and/or utilizing short test structures 160 and/or offset short test structures 140, as disclosed herein. As another example, the applying at 330 may include applying an open test condition, such as via and/or utilizing open test structures 170 and/or offset open test structures 150 that are disclosed herein. As yet another example, the applying at 330 may include applying a load test condition, such as via and/or utilizing load test structures 180 that are disclosed herein. As another example, the applying at 330 may include applying a thru test condition, such as via and/or utilizing thru test structures 120 that are disclosed herein.

It is within the scope of the present disclosure that the applying at 330 may include applying the same, or a single, test condition to each probe region; however, this is not required. As an example, the applying at 330 additionally or alternatively may include applying a first test condition to a selected probe region and applying a second test condition to a remainder of the probe regions. As a more specific example, the applying at 330 may include applying the short test condition, the offset short test condition, the open test condition, the offset open test condition, and/or the thru test condition to the selected probe region and applying the load test condition to the remainder of the probe regions. The predetermined test condition that is applied to each probe region may be selected and/or applied independently from the predetermined test condition that is applied to each other probe region, such as via selective configuration of a location of the test structures on and/or within the test standard.

Providing the test signal at 340 may include providing any suitable test signal to any suitable test structure via any suitable probe region in any suitable manner. As an example, the providing at 340 may include providing a single test signal to a single test structure via a single probe region. As another example, the providing at 340 may include providing a respective test signal from each probe region to each corresponding test structure.

Receiving the resultant signal at 350 may include receiving any suitable resultant signal from any suitable test structure via any suitable probe region in any suitable manner. As an example, the receiving at 350 may include receiving a single resultant signal from the single test structure via the single probe region. As another example, the receiving at 350 may include receiving a respective resultant signal from each corresponding test structure via each probe region. In general, a respective resultant signal may be generated and/or produced, by a respective test structure, responsive to receipt of a respective test signal by the respective test structure.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, the word, "similar," when utilized to compare and/or describe two components, features, details, structures, embodiments, and/or methods according to the present disclosure, is intended to convey that the two components, features, details, structures, embodiments, and/or methods correspond to one another and/or resemble one another. The word "similar" may be utilized to compare components, features, details, structures, embodiments, and/or methods that are intended to be identical, or at least substantially identical. In this context, the word "similar" may be utilized in recognition of the fact that these components, features, details, structures, embodiments, and/or methods, while intended to be identical, may not, from a practical perspective, be identical in all respects.

As an example, in the present disclosure, the offset conductor shape of elongate offset conductors 134 may be described as corresponding to, or being similar to, the thru conductor shape of elongate thru conductors 124. In this context, the offset conductor shape may be indented, or patterned, to be identical to the thru conductor shape; and the word "similar" may be utilized in recognition of the fact that, from a practical perspective, the two shapes may not be entirely identical due to limitations in the patterning process.

Illustrative, non-exclusive examples of test standards, probe systems, and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A test standard for impedance calibration of a probe system, the test standard comprising:

a test standard substrate;

a thin film thru test structure extending within a surface plane of the test standard substrate and including:

(i) a first thru contact pad, which is positioned to contact a first probe of the probe system;

(ii) a second thru contact pad, which is positioned, relative to the first thru contact pad, to contact a second probe of the probe system; and (iii) an elongate thru conductor including a first thru conductor end, which is in electrical communication with the first thru contact pad, and a second thru conductor end, which is in electrical communication with the second thru contact pad, wherein the elongate thru conductor has a thru conductor shape and a thru conductor impedance; and a thin film offset test structure extending within the surface plane and including:

(i) an offset contact pad, which is at least substantially similar to the first thru contact pad and is positioned to contact the first probe;

(ii) an offset contact region, which differs from the second thru contact pad in at least one respect and is positioned, relative to the offset contact pad, to contact the second probe; and (iii) an elongate offset conductor including a first offset conductor end, which is in electrical connection with the offset contact pad, and a second offset conductor end, which extends into physical contact with the offset contact region, wherein the elongate offset conductor has an offset conductor shape, which corresponds to the thru conductor shape, and an offset conductor impedance, which corresponds to the thru conductor impedance.

A2. The test standard of paragraph A1, wherein the offset conductor shape is similar, or at least substantially similar, to the thru conductor shape.

A3. The test standard of any of paragraphs A1-A2, wherein the offset conductor shape is identical, or at least substantially identical, to the thru conductor shape.

A4. The test standard of any of paragraphs A1-A3, wherein the offset conductor shape is patterned to be identical to the thru conductor shape.

A5. The test standard of any of paragraphs A1-A4, wherein the offset conductor shape and the thru conductor shape both include a rectangular shape.

A6. The test standard of any of paragraphs A1-A5, wherein the offset conductor shape and the thru conductor shape both include a nonlinear shape.

A7. The test standard of any of paragraphs A1-A6, wherein the offset conductor shape and the thru conductor shape both include an arcuate shape.

A8. The test standard of any of paragraphs A1-A7, wherein the offset conductor shape and the thru conductor shape both include at least two linear regions that intersect at an angle of intersection.

A9. The test standard of paragraph A8, wherein the angle of intersection is at least one of:

(i) at least 90 degrees, at least 95 degrees, at least 100 degrees, at least 105 degrees, at least 110 degrees, at least 115 degrees, at least 120 degrees, at least 125 degrees, at least 130 degrees, at least 135 degrees, or at least 140 degrees; and (ii) at most 270 degrees, at most 260 degrees, at most 250 degrees, at most 240 degrees, at most 230 degrees, at most 220 degrees, at most 210 degrees, at most 200 degrees, at most 190 degrees, at most 180 degrees, at most 175 degrees, at most 170 degrees, at most 165 degrees, at most 160 degrees, at most 155 degrees, at most 150 degrees, at most 145 degrees, at most 140 degrees, at most 135 degrees, or at most 130 degrees.

A10. The test standard of any of paragraphs A1-A9, wherein the elongate offset conductor is an offset waveguide.

A11. The test standard of any of paragraphs A1-A10, wherein the offset conductor impedance is similar, or at least substantially similar, to the thru conductor impedance.

A12. The test standard of any of paragraphs A1-A11, wherein the offset conductor impedance is matched to the thru conductor impedance to within a threshold impedance difference, optionally wherein the threshold impedance difference is less than 20%, less than 15%, less than 10%, less than 5%, less than 4%, less than 3%, less than 2%, less than 1%, less than 0.5%, less than 0.1%, less than 0.05%, or less than 0.01% of the thru conductor impedance.

A13. The test standard of any of paragraphs A1-A12, wherein the offset conductor impedance is identical, or at least substantially identical, to the thru conductor impedance.

A14. The test standard of any of paragraphs A1-A13, wherein the offset test structure further includes a conductive offset ground plane extending within the surface plane of the test standard substrate.

A15. The test standard of paragraph A14, wherein the conductive offset ground plane extends around, or entirely around, and is spaced-apart from the offset contact pad within the surface plane of the test standard substrate.

A16. The test standard of any of paragraphs A14-A15, wherein the conductive offset ground plane extends around, or entirely around, and is spaced-apart from at least a portion of the elongate offset conductor within the surface plane of the test standard substrate.

A17. The test standard of any of paragraphs A1-A16, wherein the offset test structure is an offset short.

A18. The test standard of paragraph A17, wherein the offset contact region is defined by a portion of a/the conductive offset ground plane and is in electrical communication with the second offset conductor end of the elongate offset conductor.

A19. The test standard of any of paragraphs A1-A18, wherein the offset test structure is an offset open.

A20. The test standard of paragraph A19, wherein the offset contact region is defined by an electrically insulating region that extends from the second offset conductor end of the elongate offset conductor.

A21. The test standard of paragraph A20, wherein a/the conductive offset ground plane surrounds the electrically insulating region within the surface plane of the test standard substrate.

A22. The test standard of any of paragraphs A1-A21, wherein the offset test structure is a first offset test structure, wherein the test standard further includes a second offset test structure, wherein the first offset test structure is an/the offset short, and further wherein the second offset test structure is an/the offset open.

A23. The test standard of any of paragraphs A1-A22, wherein the thru test structure further includes a conductive thru ground plane extending within the surface plane of the test standard substrate.

A24. The test standard of paragraph A23, wherein the conductive thru ground plane extends around and is spaced-apart from the first thru contact pad, the second thru contact pad, and the elongate thru conductor.

A25. The test standard of any of paragraphs A23-A24, wherein the elongate thru conductor is a thru waveguide.

A26. The test standard of any of paragraphs A1-A25, wherein the test standard further includes a short test structure extending within the surface plane of the test standard substrate.

A27. The test standard of paragraph A26, wherein the short test structure is configured to electrically interconnect the first probe and the second probe when the first probe and the second probe electrically contact the short test structure.

A28. The test standard of any of paragraphs A26-A27, wherein the short test structure includes an electrically conductive film extending across the surface plane of the test standard substrate.

A29. The test standard of any of paragraphs A1-A28, wherein the test standard further includes an open test structure extending within the surface plane of the test standard substrate.

A30. The test standard of paragraph A29, wherein the open test structure is configured to electrically isolate the first probe from the second probe when the first probe and the second probe electrically contact the open test structure.

A31. The test standard of any of paragraphs A29-A30, wherein the open test structure includes:
(i) a first open contact pad, which is positioned to contact the first probe;
(ii) a second open contact pad, which is positioned to contact the second probe; and
(iii) an electrically conductive open ground plane extending around and spaced-apart from the first open contact pad and the second open contact pad within the surface plane of the test standard substrate.

A32. The test standard of any of paragraphs A1-A31, wherein the test standard further includes a load test structure extending within the surface plane of the test standard substrate.

A33. The test standard of paragraph A32, wherein the load test structure is configured to apply a predetermined resistance between the first probe and the second probe when the first probe and the second probe electrically contact the load test structure.

A34. The test standard of any of paragraphs A32-A33, wherein the load test structure includes:
(i) a first load contact pad, which is positioned to contact the first probe;
(ii) a second load contact pad, which is positioned to contact the second probe;
(iii) an electrically conductive load ground plane extending around and spaced-apart from the first load contact pad and the second load contact pad;
(iv) a first resistive element extending in electrical communication with both the first load contact pad and the electrically conductive load ground plane; and
(v) a second resistive element extending in electrical communication with both the second load contact pad and the electrically conductive load ground plane.

B1. A test standard for impedance calibration of a probe system, wherein the probe system includes a probe head configured to simultaneously contact a plurality of devices under test (DUTs), wherein the probe head includes a plurality of probe regions, wherein each of the plurality of probe regions is positioned, relative to a remainder of the plurality of probe regions, to contact a corresponding one of the plurality of DUTs, and further wherein the test standard is configured to simultaneously contact the plurality of probe regions, the test standard comprising:
a plurality of test structures, wherein each of the plurality of test structures:
(i) is positioned, relative to a remainder of the plurality of test structures, to contact a corresponding one of the plurality of probe regions such that the plurality of test structures simultaneously contacts the plurality of probe regions when the probe head is brought into contact with the test standard;
(ii) includes a first contact region configured to contact a first probe tip of the corresponding one of the plurality of probe regions;
(iii) includes a second contact region that is spaced-apart from the first contact region and configured to contact a second probe tip of the corresponding one of the plurality of probe regions; and
(iv) is configured to apply a predetermined test condition to the corresponding one of the plurality of probe regions.

B2. The test standard of paragraph B1, wherein the predetermined test condition includes at least one of a short test condition, an open test condition, a load test condition, a thru test condition, and an offset test condition.

B3. The test standard of any of paragraphs B1-B2, wherein the predetermined test condition is the same test condition for each test structure of the plurality of test structures.

B4. The test standard of any of paragraphs B1-B3, wherein the predetermined test condition of a selected test structure of the plurality of test structures is different from the predetermined test condition of a remainder of the plurality of test structures.

B5. The test standard of any of paragraphs B1-B4, wherein the predetermined test condition of a/the selected test structure of the plurality of test structures is one of a/the short test condition, an/the open test condition, a/the thru test condition, and a/the offset test condition, and further wherein the predetermined test condition of a/the remainder of the plurality of test structures is a/the load test condition.

B6. The test standard of any of paragraphs B1-B5, wherein each of the plurality of test structures is a short test structure.

B7. The test standard of any of paragraphs B1-B6, wherein each of the plurality of test structures is an open test structure.

B8. The test standard of any of paragraphs B1-B7, wherein each of the plurality of test structures is a load test structure.

B9. The test standard of any of paragraphs B1-B8, wherein each of the plurality of test structures is a thru test structure.

B10. The test standard of any of paragraphs B1-B9, wherein each of the plurality of test structures is an offset test structure.

B11. The test standard of any of paragraphs B1-B10, wherein one of the plurality of test structures is one of a/the short test structure, an/the open test structure, and a/the thru test structure, and further wherein a/the remainder of the plurality of test structures is a/the load test structure.

B12. The test standard of any of paragraphs B1-B11, wherein the test standard includes any suitable component of any suitable test standard of any of paragraphs A1-A34.

B13. The test standard of any of paragraphs B1-B12, wherein the plurality of DUTs is arranged in a DUT array on a device substrate, wherein the plurality of test structures is arranged in a test structure array on the test standard substrate, and further wherein a relative spacing of the plurality of test structures within the test structure array corresponds to a relative spacing of the plurality of DUTs within the DUT array.

B14. The test standard of any of paragraphs B1-B13, wherein, when the probe head is brought into contact with the test standard, each of the plurality of probe regions contacts a corresponding one of the plurality of test structures.

B15. The test standard of any of paragraphs B1-B14, wherein, when the probe head is brought into contact with the test standard, the test standard applies a corresponding predetermined test condition to each of the plurality of probe regions.

B16. The test standard of any of paragraphs B1-B15, wherein the first contact region is an electrically conductive first contact pad.

B17. The test standard of any of paragraphs B1-B16, wherein the second contact region is an electrically conductive second contact pad.

B18. The test standard of any of paragraphs B1-B17, wherein each of the plurality of probe regions includes a plurality of probe tips, wherein the plurality of probe tips includes the first probe tip and the second probe tip, wherein each of the plurality of test structures includes a plurality of contact regions, wherein the plurality of contact regions includes the first contact region and the second contact region, and further wherein each of the plurality of contact regions is positioned to contact a corresponding one of the plurality of probe tips when the probe head is brought into contact with the test standard.

C1. A probe system configured to simultaneously test a plurality of devices under test (DUTs) present on a device substrate, the probe system comprising:

a probe head including a plurality of probe regions, wherein each of the plurality of probe regions is positioned, relative to a remainder of the plurality of probe regions, to contact a corresponding one of the plurality of DUTs;

a chuck including a support surface configured to support the device substrate; and the test standard of any of paragraphs B1-B18 positioned on the support surface.

C2. The probe system of paragraph C1, wherein each of the plurality of probe regions is in contact with a corresponding one of the plurality of test structures.

C3. The probe system of paragraph C2, wherein the corresponding one of the plurality of test structures applies the predetermined test condition to each of the plurality of probe regions.

C4. The probe system of any of paragraphs C1-C3, wherein the probe system is configured to simultaneously provide a corresponding test signal from each of the plurality of probe regions to the corresponding one of the plurality of test structures.

C5. The probe system of paragraph C4, wherein the corresponding test signal includes at least one of an electric current test signal, an electric voltage test signal, a digital test signal, a bit error test signal, an analog test signal, and a radio frequency (RF) test signal.

C6. The probe system of any of paragraphs C1-C5, wherein the probe system is configured to simultaneously receive a corresponding resultant signal from the corresponding one of the plurality of test signals via each of the plurality of probe regions.

C7. The probe system of paragraph C6, wherein the corresponding resultant signal includes at least one of an electric current resultant signal, an electric voltage resultant signal, a digital resultant signal, a bit error resultant signal, an analog resultant signal, and a radio frequency (RF) resultant signal.

C8. The probe system of any of paragraphs C1-C7, wherein the plurality of probe regions includes at least 2, at least 4, at least 6, at least 8, at least 10, at least 50, at least 100, at least 250, at least 500, at least 750, or at least 1000 probe regions.

D1. A test standard for impedance calibration of a probe system, wherein the probe system includes a probe head including a plurality of probe tips positioned to contact a corresponding plurality of contact pads of a device under test (DUT), the test standard comprising:

a test structure including a plurality of contact regions, wherein a relative orientation of the plurality of contact regions corresponds to a relative orientation of the plurality of probe tips such that, when the probe head is brought into contact with the test standard, each of the plurality of probe tips contacts a corresponding one of the plurality of contact regions; and an alignment structure, wherein:
  (i) the alignment structure is spaced-apart from the test structure;
  (ii) the alignment structure includes a plurality of alignment marks;
  (iii) a relative orientation of the plurality of alignment marks corresponds to the relative orientation of the plurality of contact regions; and
  (iv) a distance between each of the plurality of alignment marks and a corresponding one of the plurality of contact regions is equal, or at least substantially equal, to a distance between each other of the plurality of alignment marks and each other corresponding one of the plurality of contact regions.

D2. The test standard of paragraph D1, wherein the test standard includes a corresponding alignment mark for each of the plurality of contact regions.

D3. The test standard of any of paragraphs D1-D2, wherein the relative orientation of the plurality of alignment marks is matched to the relative orientation of the plurality of contact regions.

D4. The test standard of any of paragraphs D1-D3, wherein both the test structure and the alignment structure extend within a surface plane of a test standard substrate.

D5. The test standard of paragraph D4, wherein the plurality of alignment marks optically contrasts with the test standard substrate to permit optical detection of the plurality of alignment marks.

D6. The test standard of any of paragraphs D4-D5, wherein the plurality of alignment marks is formed from an optically reflective material.

D7. The test standard of any of paragraphs D4-D6, wherein the plurality of alignment marks is formed from an optically absorptive material.

D8. The test standard of any of paragraphs D4-D7, wherein the plurality of alignment marks is formed from at least one of a nickel alloy, a nickel chromium alloy, and a nickel chromium aluminum alloy.

D9. The test standard of any of paragraphs D1-D8, wherein the plurality of alignment marks includes at least one of:
  (i) at least 2, at least 3, at least 4, at least 5, at least 6, or at least 7 alignment marks; and
  (ii) at most 10, at most 8, at most 6, at most 4, or at most 2 alignment marks.

D10. The test standard of any of paragraphs D1-D9, wherein the test standard includes a plurality of test structures and a corresponding plurality of alignment structures.

D11. The test standard of paragraph D10, wherein each of the plurality of test structures includes a corresponding plurality of contact regions, and further wherein a relative orientation of the corresponding plurality of contact regions corresponds to the relative orientation of the plurality of probe tips.

D12. The test standard of paragraph D11, wherein:
  (i) each of the plurality of alignment structures is spaced-apart from the plurality of test structures;
  (ii) each of the plurality of alignment structures includes a corresponding plurality of alignment marks;
  (iii) a relative orientation of the corresponding plurality of alignment marks corresponds to the relative orientation of the corresponding plurality of contact regions; and
  (iv) a distance between each of the plurality of test structures and a corresponding one of the corresponding plurality of alignment structures is equal, or at least substantially equal, to a distance between each other of the plurality of test structures and each other corresponding one of the corresponding plurality of alignment structures.

D13. The test standard of any of paragraphs D1-D12, wherein the test standard includes any suitable component of any suitable test standard of any of paragraphs A1-B18.

E1. A method of calibrating a probe system, wherein the probe system includes a probe head configured to simultaneously contact a plurality of devices under test (DUTs), wherein the probe head includes a plurality of probe regions, wherein each of the plurality of probe regions is positioned, relative to a remainder of the plurality of probe regions, to contact a corresponding one of the plurality of DUTs, the method comprising:
  aligning the probe head with a test standard, wherein the test standard includes a plurality of test structures, and further wherein the aligning includes aligning each probe region of the plurality of probe regions with a corresponding test structure of the plurality of test structures;
  simultaneously contacting each probe region of the plurality of probe regions with the corresponding test structure of the plurality of test structures; and
  applying a predetermined test condition to each probe region of the plurality of probe regions with the corresponding test structure of the plurality of test structures.

E2. The method of paragraph E1, wherein the method further includes providing, and optionally simultaneously providing, a test signal from each probe region of the plurality of probe regions to the corresponding test structure of the plurality of test structures.

E3. The method of any of paragraphs E1-E2, wherein the method further includes receiving, and optionally simultaneously receiving, a resultant signal from the corresponding test structure of the plurality of test structures with each probe region of the plurality of probe regions.

E4. The method of any of paragraphs E1-E3, wherein the predetermined test condition includes at least one of a short test condition, an open test condition, a load test condition, and a thru test condition.

E5. The method of any of paragraphs E1-E4, wherein the applying the predetermined test condition includes applying the same test condition to each probe region of the plurality of probe regions.

E6. The method of any of paragraphs E1-E5, wherein the applying the predetermined test condition includes applying a first test condition to a selected probe region of the plurality of probe regions and applying a second test condition to a remainder of the plurality of probe regions.

E7. The method of any of paragraphs E1-E6, wherein the applying the predetermined test condition includes applying one of a/the short test condition, an/the open test condition, and a/the thru test condition to a/the selected probe region of the plurality of probe regions and applying a/the load test condition to a/the remainder of the plurality of probe regions.

E8. The method of any of paragraphs E1-E7, wherein the simultaneously contacting includes establishing electrical communication between a number of probe regions and a corresponding number of test structures.

E9. The method of paragraph E8, wherein the number of probe regions, or the corresponding number of test structures, includes at least 2, at least 4, at least 6, at least 8, at least 10, at least 50, at least 100, at least 250, at least 500, at least 750, or at least 1000 probe regions, or test structures.

E10. The method of any of paragraphs E1-E9, wherein the aligning includes aligning the probe head and the test standard relative to one another in a direction that is parallel to a surface plane of a test standard substrate that includes the test standard.

E11. The method of any of paragraphs E1-E10, wherein each probe region of the plurality of probe regions includes a plurality of probe tips, wherein each test structure of the plurality of test structures includes a plurality of contact regions, and further wherein the aligning includes aligning the plurality of probe tips of each probe region of the plurality of probe regions with the plurality of contact regions of each test structure of the plurality of test structures.

E12. The method of any of paragraphs E1-E11, wherein the simultaneously contacting includes moving at least one of the probe head and the test standard toward one another in a direction that is perpendicular to a/the surface plane of a/the test standard substrate that includes the test standard.

E13. The method of any of paragraphs E1-E12, wherein each test structure of the plurality of test structures is spaced-apart from each other test structure of the plurality of test structures.

E14. The method of any of paragraphs E1-E13, wherein each test structure of the plurality of test structures is electrically isolated from each other test structure of the plurality of test structures.

E15. The method of any of paragraphs E1-E14, wherein the predetermined test condition of each probe region of the plurality of probe regions is independent from the predetermined test condition of each other probe region of the plurality of probe regions.

E16. The method of any of paragraphs E1-E15, wherein the test standard includes the test standard of any of paragraphs B1-B18.

INDUSTRIAL APPLICABILITY

The test standards, probe systems, and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A test standard for impedance calibration of a probe system, wherein the probe system includes a probe head configured to simultaneously contact a plurality of devices under test (DUTs), wherein the probe head includes a plurality of probe regions, wherein each of the plurality of probe regions is positioned, relative to a remainder of the plurality of probe regions, to contact a corresponding one of the plurality of DUTs, and further wherein the test standard is configured to simultaneously contact the plurality of probe regions, the test standard comprising:
a single test standard substrate that comprises a plurality of test structures, wherein each of the plurality of test structures:
(i) is positioned, relative to a remainder of the plurality of test structures, to contact a corresponding one of the plurality of probe regions such that the plurality of test structures simultaneously contacts the plurality of probe regions when the probe head is brought into contact with the test standard;
(ii) includes a first contact region configured to contact a first probe tip of the corresponding one of the plurality of probe regions;
(iii) includes a second contact region that is spaced-apart from the first contact region and configured to contact a second probe tip of the corresponding one of the plurality of probe regions; and
(iv) is configured to apply a predetermined test condition to the corresponding one of the plurality of probe regions.

2. The test standard of claim 1, wherein the predetermined test condition includes at least one of a short test condition, an open test condition, a load test condition, a thru test condition, and an offset test condition.

3. The test standard of claim 1, wherein the predetermined test condition is the same test condition for each test structure of the plurality of test structures.

4. The test standard of claim 1, wherein the predetermined test condition of a selected test structure of the plurality of test structures is different from the predetermined test condition of a remainder of the plurality of test structures.

5. The test standard of claim 1, wherein the predetermined test condition of a selected test structure of the plurality of test structures is one of a short test condition, an open test condition, a thru test condition, and an offset test condition, and further wherein the predetermined test condition of a remainder of the plurality of test structures is a load test condition.

6. The test standard of claim 1, wherein, when the probe head is brought into contact with the test standard, each of the plurality of probe regions contacts a corresponding one of the plurality of test structures.

7. The test standard of claim 1, wherein each of the plurality of probe regions includes a plurality of probe tips, wherein the plurality of probe tips includes the first probe tip and the second probe tip, wherein each of the plurality of test structures includes a plurality of contact regions, wherein the plurality of contact regions includes the first contact region and the second contact region, and further wherein each of the plurality of contact regions is positioned to contact a corresponding one of the plurality of probe tips when the probe head is brought into contact with the test standard.

8. The test standard of claim 1 in combination with the probe system the probe system comprising:
the probe head including the plurality of probe regions; and
a chuck including a support surface configured to support a device substrate that includes the plurality of DUTs, wherein the test standard is positioned on the support surface.

9. A method of calibrating a probe system, wherein the probe system includes a probe head configured to simultaneously contact a plurality of devices under test (DUTs) formed on a device substrate, wherein the probe head includes a plurality of probe regions, wherein each of the plurality of probe regions is positioned, relative to a remainder of the plurality of probe regions, to contact a corresponding one of the plurality of DUTs, the method comprising:
aligning the probe head with a test standard, wherein the test standard includes a single test standard substrate that comprises a plurality of test structures, and further wherein the aligning includes aligning each probe region of the plurality of probe regions with a corresponding test structure of the plurality of test structures;

simultaneously contacting each probe region of the plurality of probe regions with the corresponding test structure of the plurality of test structures; and applying a predetermined test condition to each probe region of the plurality of probe regions with the corresponding test structure of the plurality of test structures.

10. The method of claim 9, wherein the applying the predetermined test condition includes applying the same test condition to each probe region of the plurality of probe regions.

11. The method of claim 9, wherein the applying the predetermined test condition includes applying a first test condition to a selected probe region of the plurality of probe regions and applying a second test condition to a remainder of the plurality of probe regions.

12. The method of claim 9, wherein the applying the predetermined test condition includes applying one of a short test condition, an open test condition, and a thru test condition to a selected probe region of the plurality of probe regions and applying a load test condition to a remainder of the plurality of probe regions.

* * * * *